United States Patent
Lai et al.

(10) Patent No.: US 7,639,769 B2
(45) Date of Patent: Dec. 29, 2009

(54) METHOD AND APPARATUS FOR PROVIDING SYNCHRONIZATION IN A COMMUNICATION SYSTEM

(75) Inventors: Yhean-Sen Lai, Warren, NJ (US); Robert Conrad Malkemes, Bricktown, NJ (US)

(73) Assignee: Agere Systems Inc., Allentown, PA (US)

(*) Notice: Subject to any disclaimer, the term of this patent is extended or adjusted under 35 U.S.C. 154(b) by 617 days.

(21) Appl. No.: 11/111,616

(22) Filed: Apr. 21, 2005

(65) Prior Publication Data

US 2006/0239393 A1    Oct. 26, 2006

(51) Int. Cl.
*H03D 3/24*    (2006.01)

(52) U.S. Cl. .................. 375/376; 375/375; 375/374; 375/327

(58) Field of Classification Search ............... 375/327, 375/376, 377, 373; 327/158, 159, 149, 161; 370/503, 535; 331/16, 57
See application file for complete search history.

(56) References Cited

U.S. PATENT DOCUMENTS

| | | | |
|---|---|---|---|
| 4,802,009 A * | 1/1989 | Hartmeier | 348/537 |
| 6,215,835 B1 * | 4/2001 | Kyles | 375/376 |
| 6,445,231 B1 * | 9/2002 | Baker et al. | 327/158 |
| 6,658,065 B1 | 12/2003 | Della Torre et al. | |
| 6,801,591 B1 * | 10/2004 | Frencken | 375/373 |
| 7,274,239 B2 * | 9/2007 | Lin | 327/277 |
| 2002/0075980 A1 * | 6/2002 | Tang et al. | 375/372 |
| 2003/0206600 A1 | 11/2003 | Vankka | |
| 2004/0000936 A1 * | 1/2004 | McCollum et al. | 327/156 |
| 2004/0062278 A1 * | 4/2004 | Hadzic et al. | 370/503 |
| 2004/0201428 A1 * | 10/2004 | Kenney et al. | 331/16 |
| 2006/0062058 A1 * | 3/2006 | Lin | 365/194 |
| 2007/0201541 A1 * | 8/2007 | Chuang et al. | 375/221 |

FOREIGN PATENT DOCUMENTS

EP      0 658 975 A1    6/1995
WO     WO 03/043206 A2    5/2003

* cited by examiner

*Primary Examiner*—Chieh M Fan
*Assistant Examiner*—Qutbuddin Ghulamali
(74) *Attorney, Agent, or Firm*—Mendelsohn, Drucker & Associates, P.C.; Steve Mendelsohn

(57) ABSTRACT

A dual loop, clock synchronization circuit for a receiver in a communication system. The circuitry uses a first loop of a digital phase lock loop for coarse synchronization to time stamps within the received data and uses a second loop for fine synchronization of a second numerically controlled oscillator.

18 Claims, 3 Drawing Sheets

METHOD AND APPARATUS FOR PROVIDING SYNCHRONIZATION IN A COMMUNICATION SYSTEM

BACKGROUND OF THE INVENTION

1. Field of the Invention

The present invention relates to communication systems and, more particularly, to circuitry for providing accurate, synchronized timing between a transmitter and receiver of multimedia content.

2. Description of the Related Art

Communication systems that communicate multimedia content, such as audio and video files, are required to utilize accurate timing such that the sequence of events within the multimedia content can be reconstructed at the receiver. To facilitate such timing synchronization certain protocols are applied to the transmission. The source circuitry (the transmitter) utilizes a time stamp flag (TSF) timer and a media access control (MAC) protocol such that a 27 MHz clock can be used in the source circuitry for timing of the transmission without directly encoding the clock into the transmission.

The sink circuitry (the receiver) utilizes the TSF to properly order the multimedia information for display by the receiver. However, the 27 MHz clock that is used in the sink circuitry is not synchronized with the source circuitry 27 MHz clock, i.e., the receiver-transmitter operate as an open-loop system with respect to the 27 MHz clock. As such, any phase shift that occurs between the source and the sink circuitry due to channel dynamics causes a timing error to accumulate between the source and sink circuitry. When the misalignment has a length of approximately a frame of multimedia data, the sink circuitry deletes or drops a frame. In most applications, a single dropped frame to realign the source and sink circuitry is not recognized by a viewer or user of the multimedia data. However, in some situations, a frame drop is recognizable to the viewer and must be avoided.

Therefore, there is a need in the art for circuitry that provides synchronization between the source and sink circuits of a communication system.

SUMMARY OF THE INVENTION

The present invention is clock synchronization circuitry for a receiver in a communication system. In the first embodiment of the invention, the time stamp flags, which are generated from source clock in a known fixed period, are transmitted to the receiver. When the time stamp flags are detected at the receiver, the receiver translates the time stamp flags of a known fixed time interval into clock cycles that are compared to the sink local clock signal to generate an error value. The error value is processed in a loop filter and coupled to a first numerically controlled oscillator (NCO) to provide a coarse timing signal. The first NCO, a comparison circuit, and a loop filter form a first loop. A second loop controls a second NCO to produce a finely controlled clock signal. In one embodiment of the invention, this circuit is used to maintain source-sink timing synchronization of a 27 MHz clock in a multimedia communications system such that frame drops are reduced.

In a second embodiment of the invention, two distinct frequency control loops are utilized to control two NCOs. The first NCO is controlled by an inner loop for coarse timing control and the second NCO is controlled by an outer loop to provide fine timing control.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
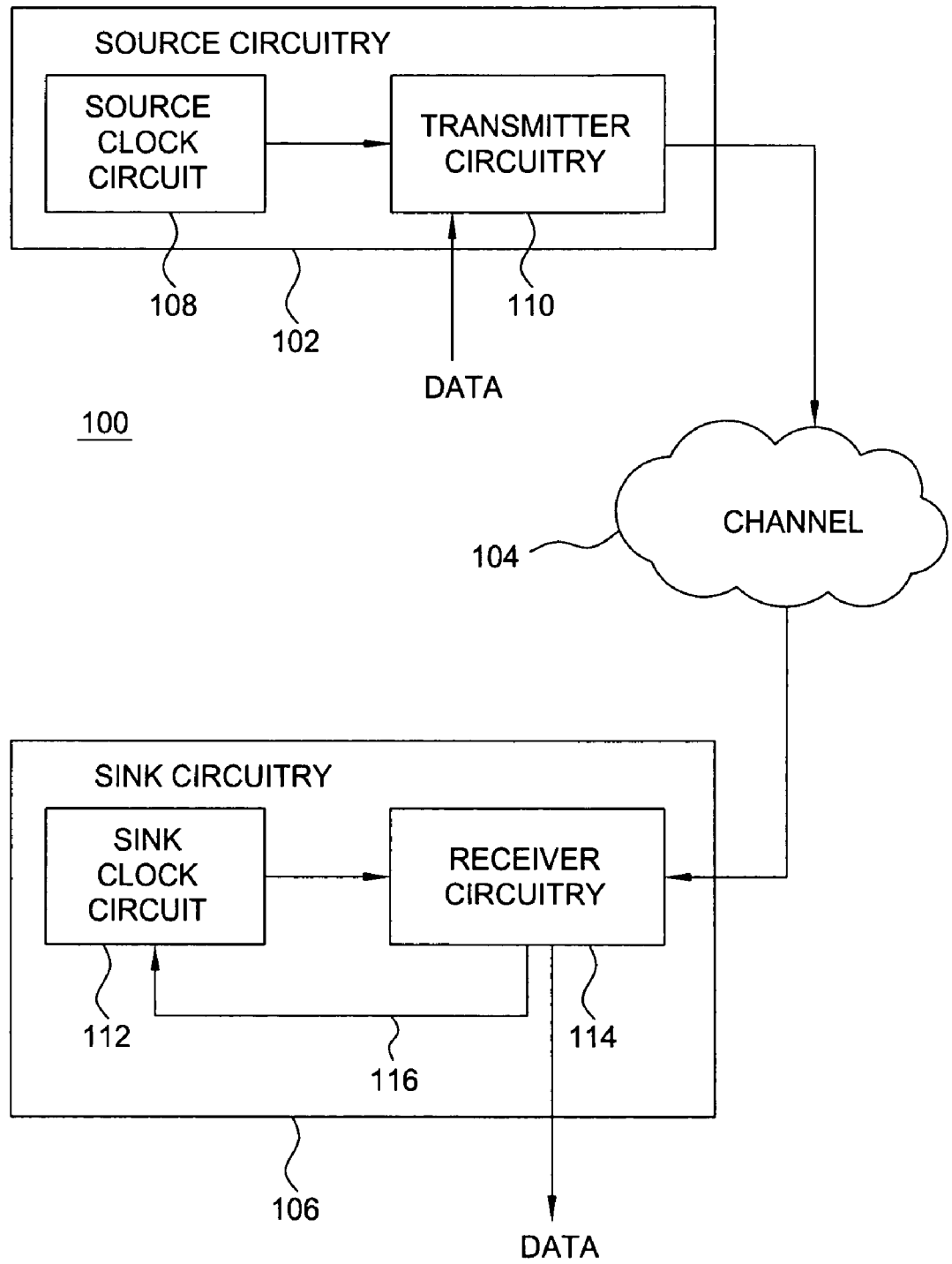
FIG. 1 depicts a block diagram of a communication system in accordance with the present invention.

FIG. 1 depicts a block diagram of a communication system 100 comprising source circuitry 102, a channel 104 and sink circuitry 106. The source circuitry 102 comprises source clock circuit 108 and transmitter circuitry 110. The transmitter circuitry 110 conventionally encodes the data, creates time stamps for the data, packetizes the data, and creates a packet stream for transmission using a media access control (MAC) layer. The source clock circuit 108 is typically, in a multimedia application, a 27 MHz clock and the data is, for example, MPEG encoded data. The clock is not encoded directly into the transmission, rather the clock is represented in the time stamps. The channel 104 is comprised of any form of transmission medium including over-the-air, Ethernet cabling, CATV cabling, fiber optic cables, telecommunications, and the like.

The sink circuitry 106 includes a sink clock circuit 112 and receiver circuitry 114. The receiver circuitry 114 extracts the time stamps from the received data and provides the time stamps on path 116. The time stamps are used by the sink clock circuit 112 to synchronize the sink clock signal to the source clock circuit 108 in accordance with the present invention. The data is extracted from the received signal using the clock signal.

Figure 2:
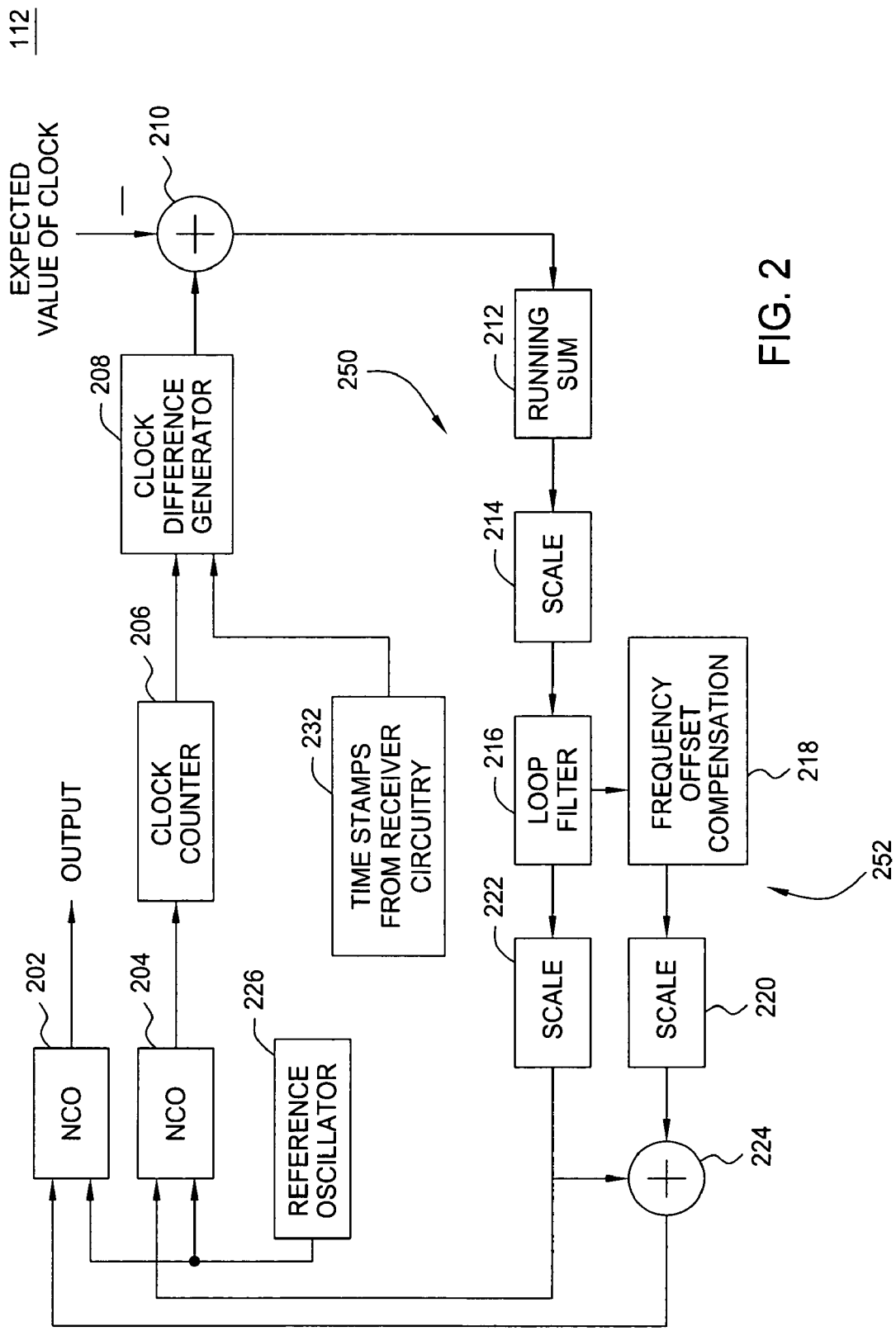
FIG. 2 depicts a block diagram of the sink clock circuitry of FIG. 1.

FIG. 2 depicts a first embodiment of the sink clock circuit 112—a dual loop, digital phase lock loop (DPLL). The clock circuit 112 receives time stamps from the receiver circuit at block 232. The time stamps can be considered as a pulse generator that creates a pulse in a fixed time interval, for example, every 100 milliseconds based upon the use of a 27 MHz transmitter clock. The local 27 MHz clock for the receiver (output of circuit 112) is generated from the local reference oscillator 226, which, for example, is a 324 MHz oscillator. The reference oscillator 226 is coupled to the numerically controlled oscillator (NCO), 202 or 204. The NCOs take the clock signal of the reference oscillator 226 as an input and generate one cycle of the local 27 MHz clock for every 12 clock cycles of the 324 MHz oscillator, i.e., 324 MHz/12=27 MHz. However, the local 27 MHz clock may have a slight frequency offset from the 27 MHz of the transmitter. Hence, the NCOs use the frequency offset information from a scaler 222 or adder 224, and occasionally add or delete one clock cycle of the 12 clock cycle period to adjust the local 27 MHz clock signal to match the received TSF of the transmitter. The reference oscillator signal is used as the reference signal for both of the numerically controlled oscillators (NCOs) 202 and 204.

The output of the NCO 204 is coupled to a clock counter 206 that counts the clock signals in a fixed period within which the coefficients of loop filter 216 are updated, for example, a 10 millisecond period. The output from the clock counter 206 is applied to a clock difference generator 208 that calculates the difference between the current counter value and previous counter value of clock counter 206 every 10 ms. The normal output of block 208 has the value of 270,000 in every 10 ms period (27 MHz.times.10 ms=270,000 cycles), i.e., without receiving a TSF signal from receiver circuitry 232, the output of the clock difference generator is merely the output of the clock counter every 10 ms. However, while the clock difference generator 208 receives the TSF signal from receiver circuitry 232, the clock difference generator 208 instantly outputs the clock difference between current value of the clock counter and the previous counter value of the clock counter at 10 ms. The output value may have a value different from 270,000, and this difference value is used to calculate the clock difference between the transmitter's and the receiver's clocks in each 100 ms period. For example, assume the time stamp flags are generated at 100 ms from the source clock, or every 2,700,000 clock cycles. If the receiver's clock has a slightly different frequency, say 2,699,000 Hz, then, every 100 ms interval, the clock difference is (27,000,000–26,990,000).times.100 ms=1000 cycles. For this example, the clock difference generator produces a count of 270,000 every 10 ms except at the 100 ms time stamp flag occurrence where the generator would produce a count of 269,000.

The output from the difference generator 208 is coupled to a subtractor 210. The subtractor 210 subtracts an expected value from the value of the difference generator 208. The expected value, when the clocks are running at 27 MHz and a 10 millisecond period is used, is set at 270000 (i.e., 27 MHz× 10 ms). For the example above where the receiver clock runs at 26.99 MHz, the output of the subtractor would be zero for most 10 ms intervals and 1000 at each 100 ms interval.

The output of the subtractor 210 (i.e., the clock error) is coupled to a running sum block 212. The running sum block 212 is a data buffer having a length of equal to n. The running sum block 212 sums the last n input data bits. The buffer size is generally set to 256, i.e., 256 data are summed. The output of the running sum block 212 is coupled to a scaler 214 that scales the input signal by a constant factor, e.g., 1/270,000. The scaler 214 is also used to establish the updating constants, $K_p$ and $K_1$ of the loop filter 216 as discussed below. The loop filter 216 is an IIR filter having a transfer function H(z) of:

$$H(z) = Kp + \frac{Ki}{1 + Z^{-1}},$$

where Kp and Ki are the gains of the IIR filter. Kp and Ki are used to control the speed of convergence of loop filter 216 and their values depend on the update rate (e.g., 10 ms). Here, Kp=0.0066 and Ki=0.0235 are chosen as exemplary values.

The scaler 222 is designed to scale the output of the loop filter by a constant factor, e.g., 12. The scaler 222 has its output coupled to the NCO 204. The NCO 204 is a numerically controlled clock. In normal use, the NCO always divides the 324 MHz clock by 12 to produce a 27 MHz output. By adding or deleting an extra clock cycle of 324 MHz during some of the 12 cycle periods, the output clock signal of the NCO 204 can be coarsely synchronized to the 27 MHz clock of the source. The NCO 204 forms a phase offset accumulator which normalizes its output by using a saw tooth non-linearity having a range between 0.5 and –0.5. If the accumulator becomes greater than 0.5, then the accumulator will subtract 1 and add one clock cycle of the 324 MHz reference. Oppositely, if the accumulator becomes less than –0.5, the accumulator adds 1.0 and deletes one clock cycle of the 324 MHz reference to its output. The NCO 204, counter 206, difference generator 208, subtractor 210, running sum block 212, scalers 214 and 222 and the loop filter 216 form a first loop 250 of the dual loop DPLL. The first loop 250 performs coarse timing synchronization. A second loop 252 includes the components of the first loop plus a frequency offset compensator 218, scaler 220, subtractor 224, and NCO 202. The second loop 252 provides fine tuning of the NCO 202.

The frequency offset compensator 218 is coupled to the loop filter 216 and is used as part of the second loop 252 to tune the NCO 202. The frequency offset compensator 218 monitors a frequency offset produced by the loop filter 216. The compensator 218 uses a table mapping or a simple function to process the frequency offset and determine how much frequency offset is needed to be compensated to accurately tune the NCO 202. For example, if the frequency offset measured in parts per million (ppm) is equal to 33, then the system needs to add about 24 Hz to the output of the NCO 202. The scaling block 220 adds a constant to the frequency offset compensator output. An addition generator 224 adds the frequency offset compensator output from output of scaler 222. The sum signal created by the adder 224 is applied to the NCO 202 to adjust its frequency in a fine manner to obtain an accurate 27 MHz clock that is synchronized to the time stamps produced by the source circuitry.

In this manner, the sink clock is essentially synchronized to the source clock using a dual loop, DPLL and thus will avoid the need to drop frames to maintain synchronization.

Figure 3:
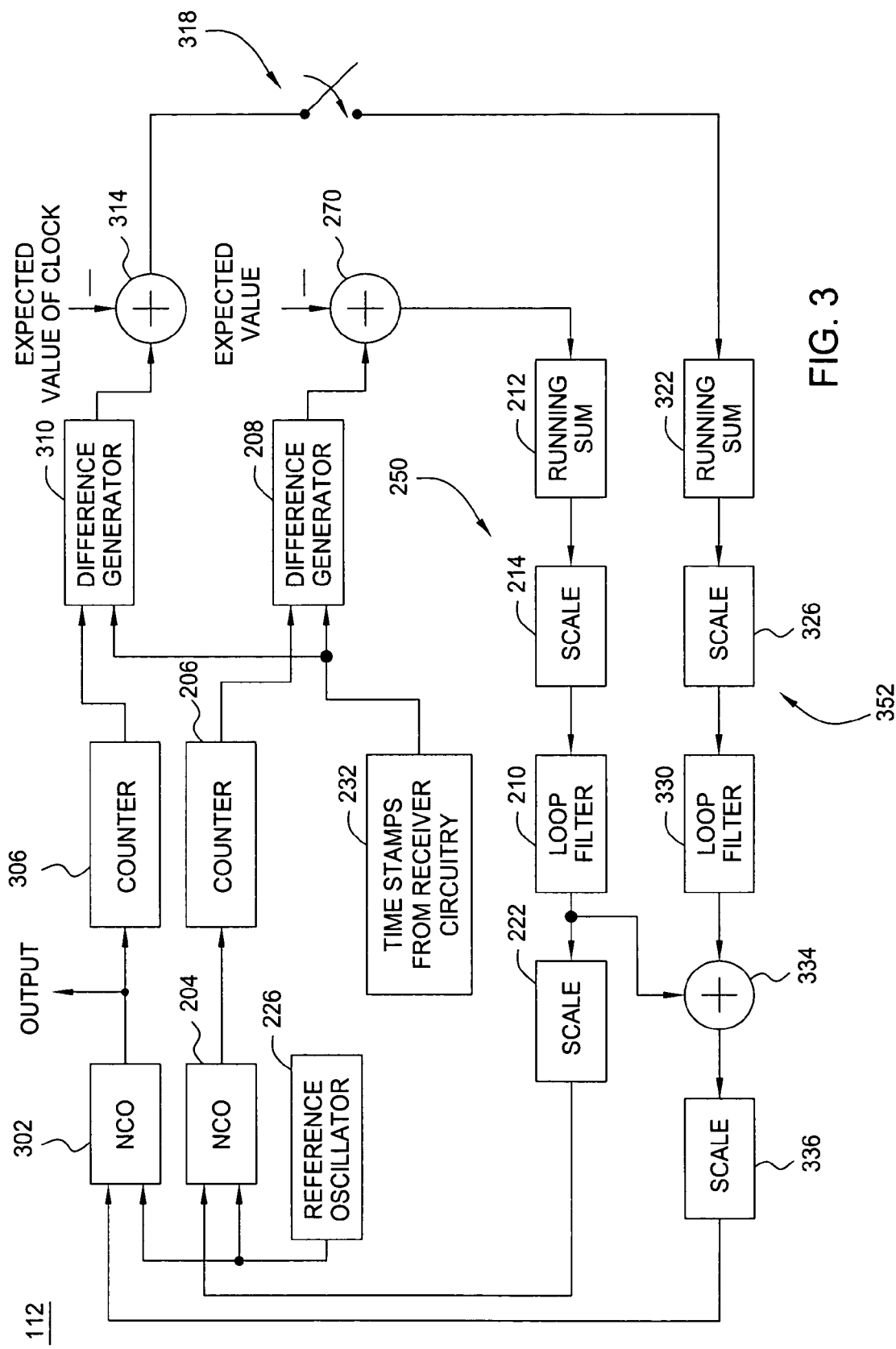
FIG. 3 depicts a second embodiment of the sink clock circuitry of FIG. 1.

FIG. 3 depicts a block diagram of a second embodiment of the sink clock circuit 112 of the present invention. The circuit 112 of FIG. 3 is similar to FIG. 2, except that a switched second loop 352 is used to adjust a corrected 27 MHz clock NCO 302. The common circuit elements have the same number and function as described with respect to FIG. 2. As such, the inner loop (first loop 250) comprising the difference generator 208, the subtractor 210, the running sum block 212, the scaler 214, the loop filter 216, the scaler 222, the NCO 204, and counter 206 all operate in the same manner as described above with respect to FIG. 2. These elements form the first loop 250 (an inner loop). The outer loop 352 comprises difference generator 310, subtractor 314, switch 318, running sum block 322, scaler 326, loop filter 330, addition generator 334, scaler 336, NCO 302 and counter 306. This outer loop 352 is enabled by switch 318 after the inner loop 350 has reached a stable condition. The inner loop 350 is used to bring the sink clock quickly into synchronization with the source clock, and then the outer loop 352 is used to fine tune the sink clock to achieve accurate synchronization with the source clock. The scale factors in scale scalers 222 and 336 are set to 12 when using a 324 MHz reference oscillator, and the scale factor in the scaler 214 is 1/270000 when using a 10 ms update rate of loop filter 210. The scale factor of scaler 326 will be set to 1/27000000 with the 1 s update rate of loop filter 330. The expected value of clock is 270000 for the block 270 (10 ms reset period) and 27,000,000 for the block 314 (1 s reset period).

The time stamp flag (TSF) is chosen for 27 MHz clock synchronization between the source side and the sink side. The main reason is that the TSF timer is a most-reliable clock timer and creates a relatively low amount of phase jitter. The fixed time interval of the TSF needs to be selected to be a value that enables accurate synchronization without using an undue amount of processing power. For example, if the fixed time interval is short (e.g., less than 10 ms), then the synchronization time for the sink clock will be fast as well as being very accurate. However, because more TSFs will be transmitted through the channel, the use of a short fixed interval decreases the data throughput and increases the processing power required to process the rapidly arriving TSFs. If the fixed time interval is long, (i.e., more than one second), then the synchronization time for the sink clock will be slow as well as less accurate. However, because fewer TSFs are being transmitted, the use of a long time interval increases the data throughput and reduces the processing power of the system. A fixed time interval of about 100 ms provides relatively rapid and accurate sink clock synchronization as well as sufficient data throughput and limited power use. Additionally, a 100 ms TSF interval is evenly divisible by the 5 or 10 ms update rate used in the sink clock circuitry. By using a dual loop design with two numerically controlled oscillators to provide coarse and fine timing control, the present invention provides a very accurate clock that is synchronized to the source clock signal.

While the foregoing is directed to embodiments of the present invention, other and further embodiments of the invention may be devised without departing from the basic scope thereof, and the scope thereof is determined by the claims that follow.

The invention claimed is:

1. A dual loop, phase lock loop (PLL) comprising:
a first loop for coarsely synchronizing a first oscillator based on time stamps that are received from a data transmission; and
a second loop for finely synchronizing a second oscillator based on (1) the time stamps and (2) at least one signal generated by the first loop, wherein:
the first oscillator is adapted to generate a first clock signal; and
the first loop comprises:
a first clock difference generator adapted to generate first measured clock cycle values corresponding to numbers of cycles of the first clock signal in first time periods, wherein a time stamp received from the data transmission is used to define a first time period; and
a first subtractor adapted to generate first clock error values based on differences between the first measured clock cycle values and a first expected clock cycle value for the first clock signal, wherein the first oscillator is controlled based on the first clock error values.

2. The dual loop PLL of claim 1, wherein:
the first loop further comprises a first clock counter adapted to generate first counter values corresponding to cycles in the first clock signal for the first time periods; and
the first clock difference generator is adapted to generate the first measured clock cycle values based on differences between current first counter values corresponding to current first time periods and previous first counter values corresponding to previous first time periods.

3. The dual loop PLL of claim 1, wherein the first loop further comprises:
a first running sum block adapted to generate first running sums based on the first clock error values; and a first loop filter adapted to filter first values based on the first running sums, wherein the first oscillator is controlled based on filtered first values generated by the first loop filter.

4. The dual loop PLL of claim 3, wherein the second loop comprises a frequency offset compensator adapted to monitor a first frequency offset produced by the first loop filter to determine a second frequency offset for the second oscillator.

5. The dual loop PLL of claim 4, wherein the second loop further comprises an adder adapted to generate a sum signal based on the second frequency offset from the frequency offset compensator and a scaled frequency offset from the first loop to generate a sum signal used to adjust frequency of the second oscillator.

6. The dual loop PLL of claim 3, wherein:
the second oscillator is adapted to generate a second clock signal; and
the second loop comprises:
a second clock difference generator adapted to generate second measured clock cycle values corresponding to numbers of cycles of the second clock signal in second time periods, wherein a time stamp received from the data transmission is used to define a second time period;
a second subtractor adapted to generate second clock error values based on differences between the second measured clock cycle values and a second expected clock cycle value for the second clock signal;
a second running sum block adapted to generate second running sums based on the second clock error values;
a second loop filter adapted to filter second values based on the second running sums; and
an adder adapted to generate a sum signal based on filtered second values generated by the second loop filter and the filtered first values from the first loop filter to generate a sum signal used to adjust frequency of the second oscillator.

7. A method for generating a clock signal, the method comprising:
(a) coarsely synchronizing, within a first loop of a dual loop, phase lock loop (PLL), a first oscillator based on time stamps that are received from a data transmission; and
(b) finely synchronizing, within a second loop of the dual loop PLL, a second oscillator based on (1) the time stamps and (2) at least one signal generated by the first loop, wherein:
the first oscillator generates a first clock signal; and
the coarsely synchronizing step comprises:
generating first measured clock cycle values corresponding to numbers of cycles of the first clock signal in first time periods, wherein a time stamp received from the data transmission is used to define a first time period; and
generating first clock error values based on differences between the first measured clock cycle values and a first expected clock cycle value for the first clock signal, wherein the first oscillator is controlled based on the first clock error values.

8. The method of claim 7, wherein:
the coarsely synchronizing step further comprises generating first counter values corresponding to cycles in the first clock signal for the first time periods; and
the first measured clock cycle values are generated based on differences between current first counter values corresponding to current first time periods and previous first counter values corresponding to previous first time periods.

9. The method of claim 7, wherein the coarsely synchronizing step further comprises:
generating first running sums based on the first clock error values; and
filtering first values based on the first running sums, wherein the first oscillator is controlled based on filtered first values generated by the first loop filter.

10. The method of claim 9, wherein the finely synchronizing step comprises monitoring a first frequency offset produced by filtering the first values to determine a second frequency offset for the second oscillator.

11. The method of claim 10, wherein the finely synchronizing step further comprises generating a sum signal based on the second frequency offset and a scaled frequency offset from the coarsely synchronizing step to generate a sum signal used to adjust frequency of the second oscillator.

12. The method of claim 9, wherein:
the second oscillator generates a second clock signal; and
the finely synchronizing step comprises:
generating second measured clock cycle values corresponding to numbers of cycles of the second clock signal in second time periods, wherein a time stamp received from the data transmission is used to define a second time period;
generating second clock error values based on differences between the second measured clock cycle values and a second expected clock cycle value for the second clock signal;
generating second running sums based on the second clock error values;
filtering second values based on the second running sums to generate filtered second values; and
generating a sum signal based on the filtered second values and the filtered first values from the first loop filter to generate a sum signal used to adjust frequency of the second oscillator.

13. An apparatus for generating a clock signal, the apparatus comprising:
(a) means for coarsely synchronizing, within a first loop of a dual loop, phase lock loop (PLL), a first oscillator based on time stamps that are received from a data transmission; and
(b) means for finely synchronizing, within a second loop of the dual loop PLL, a second oscillator based on (1) the time stamps and (2) at least one signal generated by the first loop, wherein:
the first oscillator generates a first clock signal; and
the coarsely synchronizing means comprises:
means for generating first measured clock cycle values corresponding to numbers of cycles of the first clock signal in first time periods, wherein a time stamp received from the data transmission is used to define a first time period; and
means for generating first clock error values based on differences between the first measured clock cycle values and a first expected clock cycle value for the first clock signal, wherein the first oscillator is controlled based on the first clock error values.

14. The apparatus of claim 13, wherein:
the coarsely synchronizing means further comprises means for generating first counter values corresponding to cycles in the first clock signal for the first time periods; and
the first measured clock cycle values are generated based on differences between current first counter values corresponding to current first time periods and previous first counter values corresponding to previous first time periods.

15. The apparatus of claim 13, wherein the coarsely synchronizing means further comprises:
means for generating first running sums based on the first clock error values; and
means for filtering first values based on the first running sums, wherein the first oscillator is controlled based on filtered first values generated by the first loop filter.

16. The apparatus of claim 15, wherein the finely synchronizing means comprises means for monitoring a first frequency offset produced by filtering the first values to determine a second frequency offset for the second oscillator.

17. The apparatus of claim 16, wherein the finely synchronizing means further means for comprises generating a sum signal based on the second frequency offset and a scaled frequency offset from the coarsely synchronizing means to generate a sum signal used to adjust frequency of the second oscillator.

18. The apparatus of claim 15, wherein:
the second oscillator generates a second clock signal; and
the finely synchronizing means comprises:
means for generating second measured clock cycle values corresponding to numbers of cycles of the second clock signal in second time periods, wherein a time stamp received from the data transmission is used to define a second time period;
means for generating second clock error values based on differences between the second measured clock cycle values and a second expected clock cycle value for the second clock signal;
means for generating second running sums based on the second clock error values;
means for filtering second values based on the second running sums to generate filtered second values; and
means for generating a sum signal based on the filtered second values and the filtered first values from the first loop filter to generate a sum signal used to adjust frequency of the second oscillator.

* * * * *

UNITED STATES PATENT AND TRADEMARK OFFICE
CERTIFICATE OF CORRECTION

PATENT NO. : 7,639,769 B2
APPLICATION NO. : 11/111616
DATED : December 29, 2009
INVENTOR(S) : Lai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1172 days.

Signed and Sealed this

Twenty-first Day of December, 2010

David J. Kappos
*Director of the United States Patent and Trademark Office*